(12) United States Patent
Kim

(10) Patent No.: US 8,228,651 B2
(45) Date of Patent: Jul. 24, 2012

(54) ESD PROTECTION CIRCUIT

(75) Inventor: Jang-Hoo Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 59 days.

(21) Appl. No.: 12/833,703

(22) Filed: Jul. 9, 2010

(65) Prior Publication Data
US 2011/0026176 A1 Feb. 3, 2011

(30) Foreign Application Priority Data

Jul. 31, 2009 (KR) .................. 10-2009-0071016
Jul. 7, 2010 (KR) .................. 10-2010-0065405

(51) Int. Cl.
*H02H 9/00* (2006.01)
(52) U.S. Cl. .................................................. 361/56
(58) Field of Classification Search .......... 361/56
See application file for complete search history.

(56) References Cited

U.S. PATENT DOCUMENTS

| | | | | |
|---|---|---|---|---|
| 5,729,419 A * | 3/1998 | Lien | | 361/111 |
| 6,529,359 B1 * | 3/2003 | Verhaege et al. | | 361/100 |
| 7,580,233 B2 * | 8/2009 | Davis | | 361/56 |
| 2007/0002508 A1 * | 1/2007 | Vanysacker et al. | | 361/56 |
| 2007/0091524 A1 * | 4/2007 | Davis | | 361/56 |
| 2009/0122452 A1 * | 5/2009 | Okushima | | 361/56 |
| 2010/0327342 A1 * | 12/2010 | Salcedo et al. | | 257/328 |

FOREIGN PATENT DOCUMENTS

| | | |
|---|---|---|
| JP | 2001-358297 | 12/2001 |
| JP | 2007-234718 | 9/2007 |
| KR | 101998036986 | 8/1998 |
| KR | 1020080003052 | 1/2008 |

OTHER PUBLICATIONS

Notice of Allowance issued by the Korean Intellectual Property Office on Mar. 30, 2012.

* cited by examiner

*Primary Examiner* — Ronald W Leja
(74) *Attorney, Agent, or Firm* — IP & T Group LLP

(57) ABSTRACT

An electrostatic discharge (ESD) protection circuit includes an output driver, a bypass unit, and an output driver control unit. The output driver is coupled to a data output pad. The bypass unit is configured to bypass the output driver in conducting an ESD current to a ground voltage terminal. The output driver control unit is configured to interrupt an operation of the output driver when the bypass unit operates.

17 Claims, 4 Drawing Sheets

ESD PROTECTION CIRCUIT

CROSS-REFERENCES TO RELATED APPLICATIONS

The present application claims priority of Korean Patent Application Nos. 10-2009-0071016 and 10-2010-0065405, filed on Jul. 31, 2009 and Jul. 7, 2010, respectively, which are incorporated herein by reference in their entirety.

BACKGROUND OF THE INVENTION

Exemplary embodiments of the present invention relate to an electrostatic discharge (ESD) protection circuit, and more particularly, to an ESD protection circuit which is capable of protecting an input/output driver from ESD.

Reliability of semiconductor chips may deteriorate due to the ESD. The ESD may be generated when semiconductor chips are treated or mounted on systems, and such ESD damages the semiconductor chips. Therefore, the ESD protection circuits are arranged in a peripheral region of a semiconductor device in order to protect the semiconductor device from ESD. For example, ESD protection circuits are arranged around data input/output pads of a semiconductor device.

FIG. 1 is an exemplary diagram of an ESD protection circuit used in a known semiconductor memory device. In FIG. 1, the ESD protection circuit is coupled to a data input/output pad.

Referring to FIG. 1, the ESD protection circuit used in the known semiconductor memory device includes a pull-up driver P1 and a pull-down driver N2 as an output driver. The pull-up driver P1 and the pull-down driver N2 are coupled to a data input/output (DQ) pad 10. Specifically, the pull-up driver P1 and the pull-down driver N2 are coupled in series between a power supply voltage (VDD) terminal VDDQ and a ground voltage (VSS) terminal VSSQ. A pull-up resistor R2 is coupled between the DQ pad 10 and the pull-up driver P1, and a pull-down resistor R3 is coupled between the DQ pad 10 and the pull-down driver N2. The pull-up driver P1 and the pull-down driver N2 may be selectively driven by pre-drivers 20 and 30, respectively.

The ESD protection circuit used in the known semiconductor memory device further comprises an ESD protection unit 40 and a power clamp unit 50. The ESD protection unit 40 provides a discharge path of static electricity applied from the outside through the DQ pad 10. The power clamp unit 50 clamps the static electricity applied through the ESD protection unit 40.

The ESD protection unit 40 includes first and second diodes D1 and D2 coupled in series between the power supply voltage terminal VDDQ and the ground voltage terminal VSSQ. The first diode D1 receives positive (+) static electricity greater than a power supply voltage (VDD) to discharge it to the power supply voltage terminal VDDQ, or discharge it to the ground voltage terminal VSSQ through the power clamp unit 50. The second diode D2 receives negative (−) static electricity lower than a ground voltage (VSS) to discharge it to the ground voltage terminal VSSQ, or discharge it to the power supply voltage terminal VDDQ through the power clamp unit 50.

The power clamp unit 50 includes an NMOS transistor N1, a capacitor C1 and a resistor R1. The NMOS transistor N1 is coupled between the power supply voltage terminal VDDQ and the ground voltage terminal VSSQ. The capacitor C1 is coupled between the power supply voltage terminal VDDQ and a gate of the NMOS transistor N1, and the resistor R1 is coupled between the gate of the NMOS transistor N1 and the ground voltage terminal VSSQ.

When the pre-driver 30 is driven, the known ESD protection circuit configured as above pulls down a voltage of an output node through the pull-down driver N2. On the other hand, when the pre-driver 20 is driven, the known ESD protection circuit pulls up the voltage of the output node through the pull-up driver P1. When the pull-up/pull-down operations are performed, the pull-up and pull-down resistors R2 and R3 affects a linearity of a pull-down current and a pull-up current with respect to a voltage applied to the DQ pad 10.

That is, the pull-up and pull-down resistors R2 and R3 serve to interrupt an ESD voltage and an ESD current. However, the pull-up and pull-down resistors R2 and R3 may degrade the I/O buffer interface specification (IBIS) characteristic of an output driver. In particular, since a low-power semiconductor lowers an operating voltage and the pull-up and pull-down resistors R2 and R3 serve to attenuate an output voltage and an output current, the slopes of the linear and saturation regions of the output driver are reduced, resulting in degradation of IBIS characteristic.

SUMMARY OF THE INVENTION

An embodiment of the present invention is directed to an ESD protection circuit which is capable of improving IBIS characteristic of an input/output driver in low-power products and protecting the input/output driver from ESD.

In accordance with an exemplary embodiment of the present invention, an ESD protection circuit includes an output driver coupled to a data output pad, a bypass unit configured to bypass the output driver in conducting an ESD current to a ground voltage terminal, and an output driver control unit configured to interrupt an operation of the output driver when the bypass unit operates.

In accordance with another exemplary embodiment of the present invention, an ESD protection circuit includes a pull-up driver and a pull-down driver coupled to a data output pad, a pre-driver configured to selectively enable the pull-up driver and the pull-down driver, a bypass unit configured to bypass the pull-up driver and the pull-down driver in conducting an ESD current to a ground voltage terminal, and a control unit configured to control a trigger voltage supplied from the pre-driver to the pull-up driver and the pull-down driver when the bypass unit operates.

DESCRIPTION OF SPECIFIC EMBODIMENTS

Figure 1:
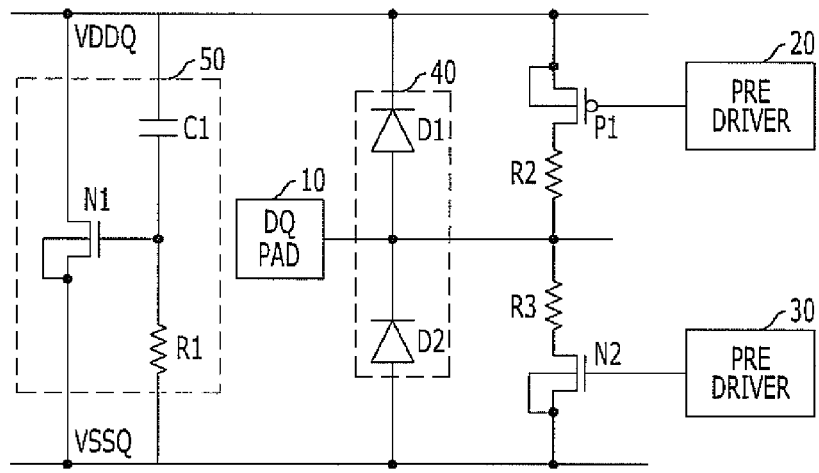
FIG. 1 is a circuit diagram of a known ESD protection circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
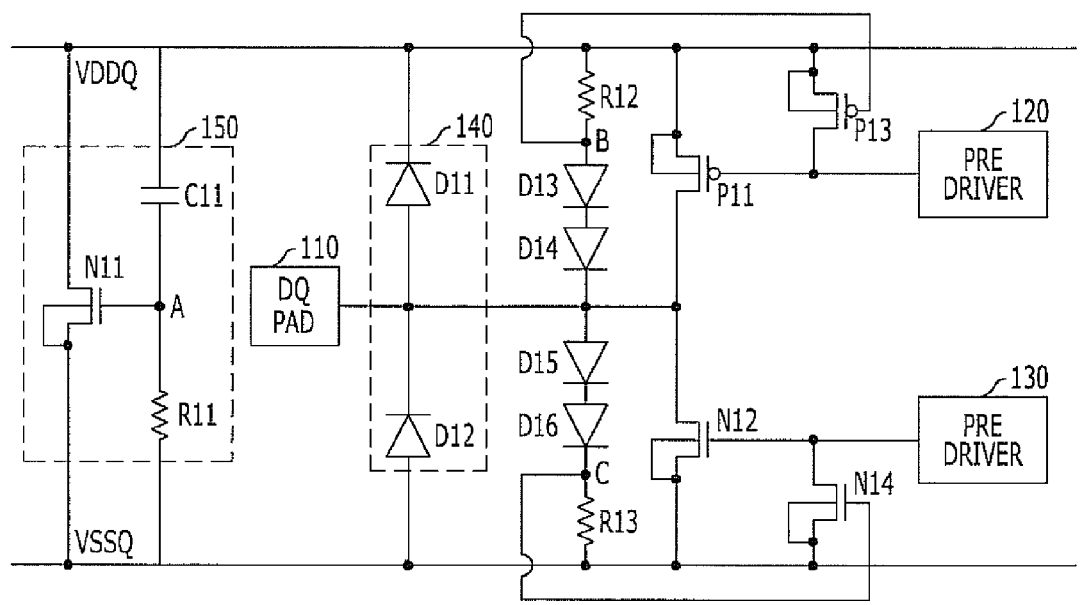
FIG. 2 is a circuit diagram of an ESD protection circuit in accordance with an embodiment of the present invention.

FIG. 2 is a configuration diagram of an ESD protection circuit in accordance with an exemplary embodiment of the present invention.

Referring to FIG. 2, the ESD protection circuit in accordance with the exemplary embodiment includes a pull-up driver P11 and a pull-down driver N12 coupled in series between a power supply voltage (VDD) terminal VDDQ and a ground voltage (VSS) terminal VSSQ. A voltage which is pulled up or pulled down by the pull-up driver P11 and the pull-down driver N12 is output to a data input/output (DQ) pad 110. The pull-up driver P11 is driven by a pre-driver 120, and the pull-down driver N12 is driven by a pre-driver 130.

The ESD protection circuit in accordance with this exemplary embodiment further comprises an ESD protection unit 140 and a power clamp unit 150. The ESD protection unit 140 provides a discharge path of static electricity applied from the outside through the DQ pad 110. The power clamp unit 150 clamps the static electricity applied through the ESD protection unit 140.

The ESD protection unit 140 includes first and second diodes D11 and D12 coupled in series between the power supply voltage terminal VDDQ and the ground voltage terminal VSSQ. The first diode D11 receives positive (+) static electricity greater than a power supply voltage (VDD) to discharge it to the power supply voltage terminal VDDQ, or discharge it to the ground voltage terminal VSSQ through the power clamp unit 150. The second diode D12 receives negative (−) static electricity lower than a ground voltage (VSS) to discharge it to the ground voltage terminal VSSQ, or discharge it to the power supply voltage terminal VDDQ through the power clamp unit 150.

The power clamp unit 150 includes an NMOS transistor N11, a capacitor C11 and a first resistor R11. The NMOS transistor N11 is coupled between the power supply voltage terminal VDDQ and the ground voltage terminal VSSQ. The capacitor C11 is coupled between the power supply voltage terminal VDDQ and a gate of the NMOS transistor N11, and the first resistor R11 is coupled between the gate of the NMOS transistor N11 and the ground voltage terminal VSSQ. A voltage to be applied to a gate of the NMOS transistor N11 is determined according to the first resistor R11 and the capacitor C11 coupled in series.

For convenience, an operation of the power clamp unit 150 is explained in case that the positive (+) static electricity is discharged to the ground voltage terminal VSSQ.

The capacitor C11 receives the positive (+) static electricity through the power supply voltage terminal VDDQ to emit an ESD current to a node A. The first resistor R11 receives the ESD current from the node A to invoke a voltage at the node A coupled to the gate of the NMOS transistor N11. When the voltage at the node A is greater than a threshold voltage of the NMOS transistor N11, a current flows through a drain-source path of the NMOS transistor N11. As a result, the ESD current flows to the ground voltage terminal VSSQ through the drain-source path of the NMOS transistor N11. As described above, when a gate-source voltage of the NMOS transistor N11 is greater than the threshold voltage of the NMOS transistor N11, the power clamp unit 150 discharges the positive (+) static electricity to the ground voltage terminal VSSQ.

Also, the ESD protection circuit in accordance with this exemplary embodiment includes third and fourth diodes D13 and D14 coupled in parallel to the pull-up driver P11 serving as an output driver. That is, the third and fourth diodes D13 and D14 are arranged between the power supply voltage terminal VDDQ and the DQ pad 110 and coupled in parallel to the pull-up driver P11. The third and fourth diodes D13 and D14 serve to bypass the ESD current so that the ESD current does not flow to the output driver. A P-type electrode of the third diode D13 is coupled to the power supply voltage terminal VDDQ through a second resistor R12, and an N-type electrode of the fourth diode D14 is coupled to the DQ pad 110.

In addition, a PMOS transistor P13 is arranged in order to increase a trigger voltage of the pull-up driver P11 serving as the output driver. A source of the PMOS transistor P13 is coupled to the power supply voltage terminal VDDQ, a drain of the PMOS transistor P13 is coupled to a gate of the pull-up driver P11, and a gate of the PMOS transistor P13 is coupled to a connection node B between the second resistor R12 and the third diode D13.

Also, the ESD protection circuit in accordance with this exemplary embodiment includes fifth and sixth diodes D15 and D16 coupled in parallel to the pull-down driver N12 serving as the output driver. That is, the fifth and sixth diodes D15 and D16 are arranged between the DQ pad 110 and the ground voltage terminal VSSQ and coupled in parallel to the pull-down driver N12. The fifth and sixth diodes D15 and D16 serve to bypass the ESD current so that the ESD current does not flow to the output driver. A P-type electrode of the fifth diode D15 is coupled to the DQ pad 110, and an N-type electrode of the sixth diode D16 is coupled to the ground voltage terminal VSSQ through a third resistor R13.

In addition, an NMOS transistor N14 is provided in order to increase a trigger voltage of the pull-down driver N12 serving as the output driver. A source of the NMOS transistor N14 is coupled to the ground voltage terminal VSSQ, a drain of the NMOS transistor N14 is coupled to a gate of the pull-down driver N12, and a gate of the NMOS transistor N14 is coupled to a connection node C between the third resistor R13 and the sixth diode D16.

Hereinafter, an operation of the ESD protection circuit configured above will be described below.

In a normal operation, IBIS characteristic does not deteriorate because no resistor is coupled to the output drivers P11 and N12. For example, the operating voltage of the low-power semiconductor circuit is approximately 1.8 V, 1.2 V, or less, and the turn-on voltage of the diode is approximately 1 V. Accordingly, two diodes coupled in series are not turned on in the normal operation. In this case, the PMOS transistor P13 coupled to the gate of the pull-up driver P11 is maintained in a turned-off state. Likewise, the NMOS transistor N14 coupled to the gate of the pull-down driver N12 is also maintained in a turned-off state. For reference, although the description has been made of two diodes, the number of the diode may differ according to the operating voltage of the semiconductor circuit.

In this case, when the pre-driver 130 is activated, the voltage of the output node is pulled down through the pull-down driver N12. On the other hand, when the pre-driver 120 is activated, the voltage of the output node is pulled up through the pull-up driver P11.

Figure 3:
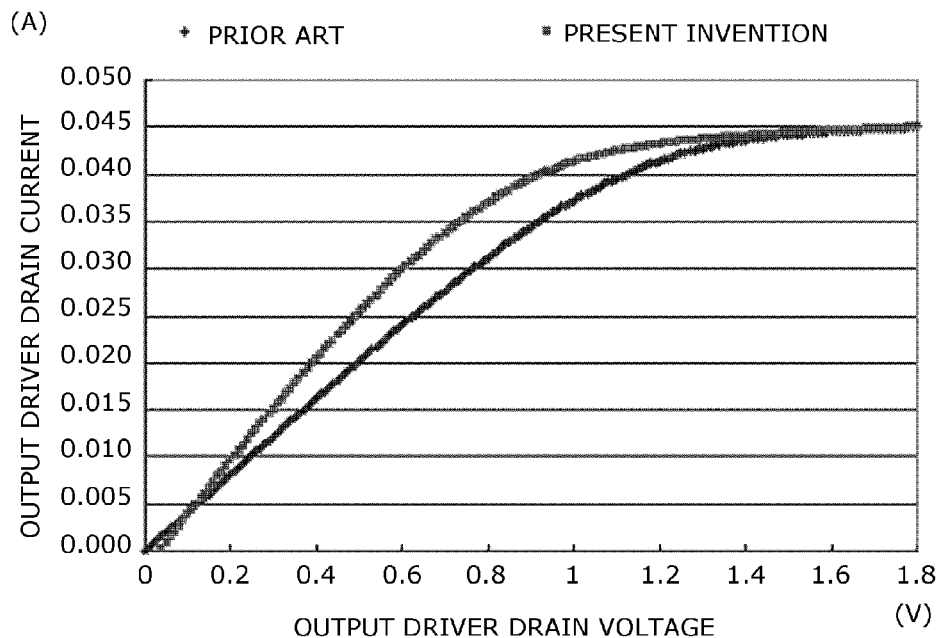
FIG. 3 is a graph showing IBIS characteristics of an output driver, depending on presence or absence of resistors coupled to the output driver.

For reference, FIG. 3 is a graph showing IBIS characteristics of the output driver, depending on presence or absence of resistors coupled to the output driver.

Referring to FIGS. 1 through 3, the IBIS characteristic of the known output drivers P1 and N2 deteriorates due to the pull-up resistor R2 and the pull-down resistor R3, which are coupled in series to the DQ pad 10. On the contrary, the IBIS characteristic of the output drivers P11 and N12 in accordance with this exemplary embodiment of the present invention is improved since no resistor is coupled to the output drivers P11 and N12.

Meanwhile, in an ESD mode, the third to sixth diodes D13 to D16 coupled in series are turned on when the ESD current is discharged. Accordingly, the ESD current flows. At this time, since a voltage drop occurs due to the second and third resistor R12 and R13 coupled in series to the third to sixth diodes D13 to D16, the PMOS transistor P13 and the NMOS transistor N14 are turned on.

When the PMOS transistor P13 is turned on, the power supply voltage terminal VDDQ is coupled through the turned-on PMOS transistor P13 to the gate of the pull-up driver P11. Likewise, when the NMOS transistor N14 is turned on, the ground voltage terminal VSSQ is coupled through the turned-on NMOS transistor N14 to the gate of the pull-down driver N12. As a result, the pull-up driver P11 operates as a Gate-Powered PMOS (GPPMOS) transistor and the pull-down driver N12 operates as a Gate-Grounded NMOS (GGNMOS).

Figure 4:
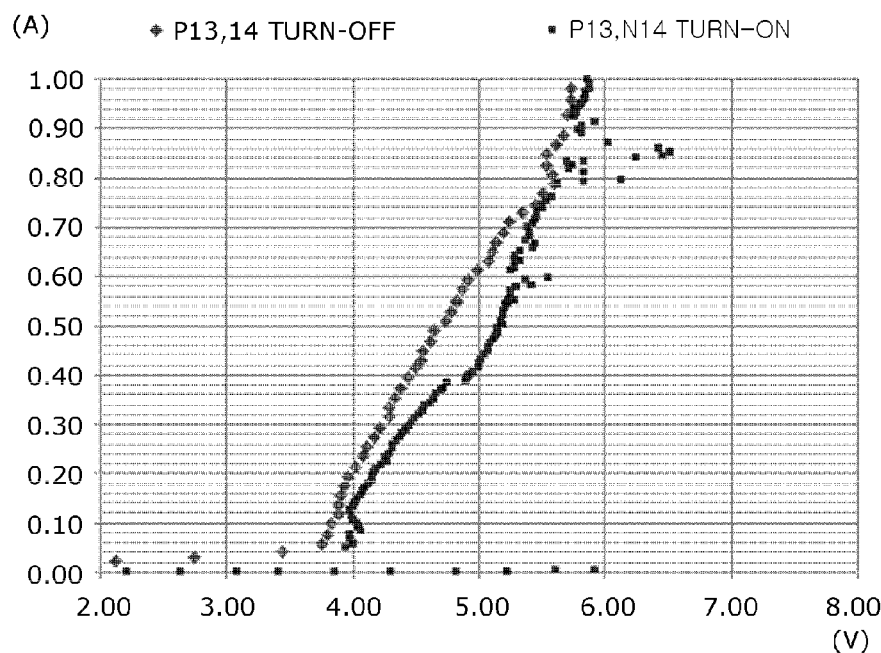
FIG. 4 is a graph showing trigger voltage characteristics of a pull-up driver and a pull-down driver according to whether a PMOS transistor P13 and an NMOS transistor N14 are turned on or turned off.

FIG. 4 is a graph showing trigger voltage characteristics of the pull-up driver P11 and the pull-down driver N12 according to whether the PMOS transistor P13 and the NMOS transistor N14 are turned on or turned off.

Referring to FIG. 4, when the PMOS transistor P13 and the NMOS transistor N14 are turned off, the trigger voltage of the pull-up driver P11 and the pull-down driver N12 is less than approximately 4V. On the other hand, when the PMOS transistor P13 and the NMOS transistor N14 are turned on, the trigger voltage of the pull-up driver P11 and the pull-down driver N12 increases up to approximately 6V.

Therefore, when the static electricity turns on the third to sixth diodes D13 to D16 coupled in series and thus is bypassed to the ground voltage terminal VSSQ, the power supply voltage terminal VDDQ is coupled to the pull-up driver P11, and the ground voltage terminal VSSQ is coupled to the pull-down driver N12. As a result, the pull-up driver P11 operates as a GPPMOS transistor, and the pull-down driver N12 operates as a GGNMOS. Due to such an operation, the trigger voltage of the output driver increases, and the static electricity is discharged to the ground voltage terminal VSSQ through the turned-on diodes D13 to D16.

Here, sizes of the third to sixth diodes D13 to D16 do not require being the same as those of the first and second diodes D11 and D12 of the ESD protection unit 140. This is because it requires flowing an ESD current for invoking a voltage to turn on the first and second diodes D11 and D12.

Figure 5:
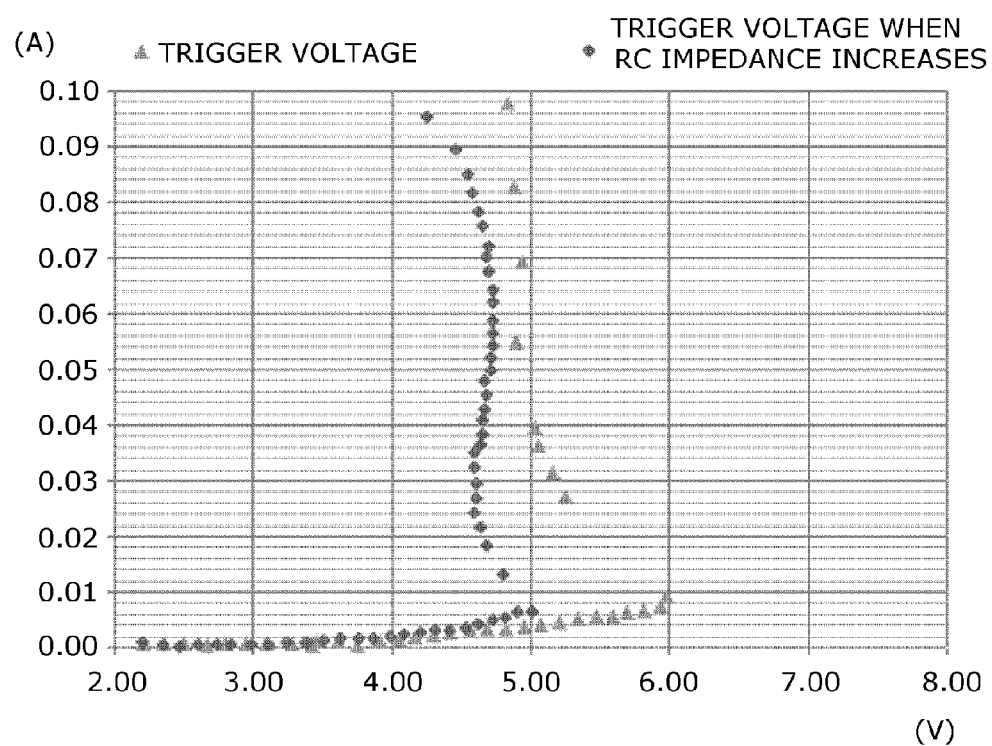
FIG. 5 is a graph showing trigger voltage characteristics according to whether an RC impedance of a power clamp unit are adjusted or not.

FIG. 5 is a graph showing trigger voltage characteristics according to whether an RC impedance of the capacitor C11 and the first capacitor R11 included in the power clamp unit 150 are adjusted or not.

Referring to FIG. 5, when a trigger voltage to turn on elements included in the ESD protection unit 140 and the power clamp unit 150 is approximately 6V, the trigger voltage may be reduced to approximately 5V by increasing the RC impedance of the capacitor C11 and the first capacitor R11 included in the power clamp unit 150. In particular, it is assumed that a turn-on voltage of the output driver increases to approximately 6V and a turn-on characteristic of the power clamp unit 150 is set to approximately 5V. In this case, a discharge path of static electricity may be formed, exclusive of the output driver. Accordingly, the present invention may improve not only ESD characteristic of the output driver but also IBIS characteristic of the output driver.

Figure 6:
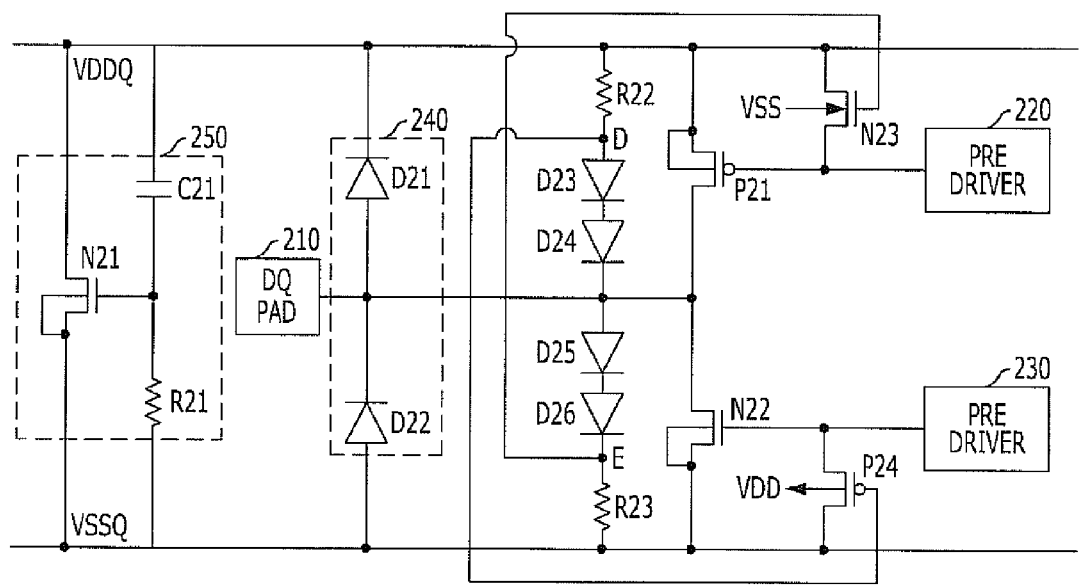
FIG. 6 is a circuit diagram of an ESD protection circuit in accordance with another exemplary embodiment of the present invention.

FIG. 6 is a circuit diagram of an ESD protection circuit in accordance with another exemplary embodiment of the present invention.

Referring to FIG. 6, the ESD protection circuit in accordance with this exemplary embodiment includes a pull-up driver P21 and a pull-down driver N22 coupled in series between a power supply voltage (VDD) terminal VDDQ and a ground voltage (VSS) terminal VSSQ. An NMOS transistor N23 is arranged in order to increase a trigger voltage of the pull-up driver P21 serving as the output driver. A PMOS transistor P24 is arranged in order to increase a trigger voltage of the pull-down driver N22 serving as the output driver.

Also, the ESD protection circuit in accordance with this exemplary embodiment includes third and fourth diodes D23 and D24 coupled between the power supply voltage terminal VDDQ and a DQ pad 210 and coupled in parallel to the pull-up driver P21. The third and fourth diodes D23 and D24 serve to bypass the ESD current so that the ESD current does not flow to the output driver. A P-type electrode of the third diode D23 is coupled to the power supply voltage terminal VDDQ through a second resistor R22, and an N-type electrode of the fourth diode D24 is coupled to the DQ pad 210.

Also, the ESD protection circuit in accordance with this exemplary embodiment includes diodes fifth and sixth D25 and D26 coupled between the DQ pad 210 and the ground voltage terminal VSSQ and coupled in parallel to the pull-down driver N22. The fifth and sixth diodes D25 and D26 serve to bypass the ESD current so that the ESD current does not flow to the output driver. A P-type electrode of the fifth diode D25 is coupled to the DQ pad 210, and an N-type electrode of the sixth diode D26 is coupled to the ground voltage terminal VSSQ through a third resistor R23.

A drain of the NMOS transistor N23 is coupled to the power supply voltage terminal VDDQ, a source of the NMOS transistor N23 is coupled to a gate of the pull-up driver P21, and a gate of the NMOS transistor N23 is coupled to a connection node E between the sixth diode D26 and the third resistor R23.

Further, a drain of the PMOS transistor P24 is coupled to the ground voltage terminal VSSQ, a source of the PMOS transistor P24 is coupled to a gate of the pull-down driver N22, and a gate of the PMOS transistor P24 is coupled to a connection node D between the second resistor R22 and the third diode D23.

Hereinafter, an operation of the ESD protection circuit configured above will be described below.

In a normal operation, IBIS characteristic does not deteriorate because no resistor is coupled to the output drivers P21 and N22. In this case, the NMOS transistor N23 coupled to the gate of the pull-up driver P21 is maintained in a turned-off state, and the PMOS transistor P24 coupled to the gate of the pull-down driver N22 is also maintained in a turned-off state. Accordingly, when the pre-driver 230 is activated, the voltage of the output node is pulled down through the pull-down driver N22. On the other hand, when the pre-driver 220 is activated, the voltage of the output node is pulled up through the pull-up driver P21.

Meanwhile, in an ESD mode, the third to sixth diodes D23 to D26 coupled in series are turned on when the ESD current is discharged. Accordingly, the ESD current flows. At this time, since a voltage drop occurs due to the second and third resistor R22 and R23 coupled in series to the third to sixth diodes D23 to D26, the NMOS transistor N23 and the PMOS transistor P24 are turned on.

When the NMOS transistor N23 is turned on, the power supply voltage terminal VDDQ is coupled through the turned-on NMOS transistor N23 to the gate of the pull-up driver P21. Likewise, when the PMOS transistor P24 is turned on, the ground voltage terminal VSSQ is coupled through the turned-on PMOS transistor P24 to the gate of the pull-down driver N22. As a result, the pull-up driver P21 operates as a Gate-Powered PMOS (GPPMOS) transistor and the pull-down driver N22 operates as a Gate-Grounded NMOS (GGNMOS).

Therefore, when the static electricity turns on the third to sixth diodes D23 to D26 coupled in series and thus is bypassed to the ground voltage terminal VSSQ, the power supply voltage terminal VDDQ is coupled to the pull-up driver P21, and the ground voltage terminal VSSQ is coupled to the pull-down driver N22. As a result, the pull-up driver P21 operates as a GPPMOS transistor, and the pull-down driver N22 operates as a GGNMOS. Due to such an operation, the trigger voltage of the output driver increases, and the static electricity is discharged to the ground voltage terminal VSSQ through the turned-on diodes D23 to D26.

In accordance with the exemplary embodiments of the present invention, when ESD is generated, the generated ESD current is controlled to be bypassed to the ground voltage terminal, without damaging the output driver. To this end, the path for bypassing the ESD current is formed, and the operation of the output driver is interrupted when the bypass path operates. Therefore, the ESD protection circuits in accordance with the exemplary embodiments of the present invention can reduce a probability of a damage occurrence by ESD in the output driver and improve IBIS characteristics. Consequently, input/output characteristics of the semiconductor device may be improved.

While the present invention has been described with respect to the specific embodiments, it will be apparent to those skilled in the art that various changes and modifications may be made without departing from the spirit and scope of the invention as defined in the following claims.

What is claimed is:

1. An electrostatic discharge (ESD) protection circuit, comprising:
   an output driver coupled to a data output pad;
   a bypass unit configured to bypass an ESD current in conducting an ESD current to a ground voltage terminal; and
   an output driver control unit configured to interrupt an operation of the output driver when the bypass unit operates,
   wherein the bypass unit comprises a first resistor, a diode chain comprising a plurality of diodes, and a second resistor that are coupled in series between a power supply voltage terminal and the ground voltage terminal, and the output driver control unit is configured to be switched on in response to a signal at a first connection node between the diode chain and the first resistor and in response to a signal at a second connection node between the diode chain and the second resistor.

2. The ESD protection circuit of claim 1, wherein a node between the diodes of the diode chain in the bypass unit is coupled to the data output pad.

3. The ESD protection circuit of claim 1, wherein the output driver comprises a pull-up driver and a pull-down driver coupled in series between the power supply voltage terminal and the ground voltage terminal.

4. The ESD protection circuit of claim 3, wherein the output driver control unit comprises a connection unit configured to couple the power supply voltage terminal with the pull-up driver and switched on in response to one of the signals at the first and second connection nodes.

5. The ESD protection circuit of claim 4, wherein the connection unit is configured to increase an operating voltage of the pull-up driver.

6. The ESD protection circuit of claim 3, wherein the output driver control unit comprises a connection unit configured to couple the pull-down driver and the ground voltage terminal and switched on in response to one of the signals at the first and second connection nodes.

7. The ESD protection circuit of claim 6, wherein the connection unit is configured to increase an operating voltage of the pull-down driver.

8. The ESD protection circuit of claim 1, wherein the output driver control unit comprises a PMOS transistor configured to have a source-drain path coupled between the power supply voltage terminal and a pull-up driver of the output driver, wherein a gate of the PMOS transistor is coupled to the first connection node.

9. The ESD protection circuit of claim 1, wherein the output driver control unit comprises an NMOS transistor configured to have a source-drain path coupled between the ground voltage terminal and a pull-down driver of the output driver, wherein a gate of the NMOS transistor is coupled to the second connection node.

10. The ESD protection circuit of claim 1, wherein the output driver control unit comprises an NMOS transistor configured to have a source-drain path coupled between the power supply voltage terminal and a pull-up driver of the output driver, wherein a gate of the NMOS transistor is coupled to the second connection node.

11. The ESD protection circuit of claim 1, wherein the output driver control unit comprises a PMOS transistor configured to have a source-drain path coupled between the ground voltage terminal and a pull-down driver of the output driver, wherein a gate of the PMOS transistor is coupled to the first connection node.

12. An ESD protection circuit, comprising:
   a pull-up driver and a pull-down driver coupled to a data output pad;
   a pre-driver configured to selectively enable the pull-up driver and the pull-down driver;
   a bypass unit configured to bypass the pull-up driver and the pull-down driver in conducting an ESD current to a ground voltage terminal; and
   a control unit configured to control trigger voltages supplied from the pre-driver to the pull-up driver and the pull-down driver when the bypass unit operates,
   wherein the bypass unit comprises a first resistor, a diode chain comprising a plurality of diodes, and a second resistor that are coupled in series between a power supply voltage terminal and the ground voltage terminal, and the control unit is configured to be switched on in response to a signal at a first connection node between the diode chain and the first resistor and in response to a signal at a second connection node between the diode chain and the second resistor.

13. The ESD protection circuit of claim 12, wherein a node between the diodes of the diode chain in the bypass unit is coupled to the data output node.

14. The ESD protection circuit of claim 12, wherein the control unit comprises a PMOS transistor configured to have a source-drain path coupled between the power supply voltage terminal and the pull-up driver, wherein a gate of the PMOS transistor is coupled to the first connection node.

15. The ESD protection circuit of claim 12, wherein the control unit comprises an NMOS transistor configured to have a source-drain path coupled between the ground voltage terminal and the pull-down driver, wherein a gate of the NMOS transistor is coupled to the second connection node.

16. The ESD protection circuit of claim 12, wherein the control unit comprises an NMOS transistor configured to have a source-drain path coupled between the power supply voltage terminal and the pull-up driver, wherein a gate of the NMOS transistor is coupled to the second connection node.

17. The ESD protection circuit of claim 12, wherein the control unit comprises a PMOS transistor configured to have a source-drain path coupled between the ground voltage terminal and the pull-down driver, wherein a gate of the PMOS transistor is coupled to the first connection node.

* * * * *